US008472201B2

(12) United States Patent
Takahashi

(10) Patent No.: US 8,472,201 B2
(45) Date of Patent: Jun. 25, 2013

(54) CIRCUIT MODULE

(75) Inventor: Yasuhiro Takahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 246 days.

(21) Appl. No.: 13/049,965

(22) Filed: Mar. 17, 2011

(65) Prior Publication Data

US 2011/0228499 A1 Sep. 22, 2011

(30) Foreign Application Priority Data

Mar. 19, 2010 (JP) ................................. 2010-064292

(51) Int. Cl.
*H05K 1/00* (2006.01)
*H05K 1/18* (2006.01)
*H05K 7/00* (2006.01)
*H01P 1/36* (2006.01)
*H01P 1/32* (2006.01)

(52) U.S. Cl.
USPC ............................ 361/748; 333/24.2; 333/1.1

(58) Field of Classification Search
None
See application file for complete search history.

(56) References Cited

U.S. PATENT DOCUMENTS

| | | | | |
|---|---|---|---|---|
| 7,400,512 | B2 * | 7/2008 | Hirano et al. | 361/763 |
| 8,058,945 | B2 * | 11/2011 | Wada et al. | 333/24.2 |
| 2002/0075075 | A1 * | 6/2002 | Sasaki | 330/286 |
| 2002/0079981 | A1 * | 6/2002 | Tanaka | 333/1.1 |
| 2003/0184724 | A1 * | 10/2003 | Ono et al. | 355/72 |
| 2003/0218732 | A1 * | 11/2003 | Watson et al. | 355/53 |
| 2003/0218792 | A1 * | 11/2003 | Minemoto | 359/280 |
| 2005/0162635 | A1 * | 7/2005 | Binnard | 355/72 |
| 2006/0171091 | A1 * | 8/2006 | Seale et al. | 361/160 |
| 2007/0166599 | A1 * | 7/2007 | Burtner et al. | 429/40 |
| 2007/0235644 | A1 * | 10/2007 | Nakasuji et al. | 250/307 |
| 2007/0273288 | A1 * | 11/2007 | Burtner et al. | 315/111.81 |
| 2008/0111648 | A1 * | 5/2008 | Kawanami | 333/1.1 |
| 2008/0211563 | A1 * | 9/2008 | Inaba et al. | 327/333 |

FOREIGN PATENT DOCUMENTS

| | | | |
|---|---|---|---|
| JP | 2004-47718 | A | 2/2004 |
| JP | 2006-311455 | A | 11/2006 |

* cited by examiner

*Primary Examiner* — Hoa C Nguyen
*Assistant Examiner* — Xanthia C Cunningham
(74) *Attorney, Agent, or Firm* — Keating & Bennett, LLP

(57) ABSTRACT

An isolator includes a core isolator mounted on a circuit board and including a ferrite and permanent magnets to apply a direct-current magnetic field to the ferrite, and includes no yoke for controlling the leakage of the direct-current magnetic field out of the isolator. Power amplifiers are arranged in a straight line along with the core isolator interposed therebetween. A metal case covers the core isolator and the power amplifiers. The heights of the power amplifiers are greater than that of the core isolator.

6 Claims, 8 Drawing Sheets

CIRCUIT MODULE

BACKGROUND OF THE INVENTION

1. Field of the Invention

The present invention relates to a circuit module and more particularly to a circuit module including an isolator.

2. Description of the Related Art

Examples of known isolators include a nonreciprocal circuit device described in Japanese Unexamined Patent Application Publication No. 2006-311455. The nonreciprocal circuit device includes a ferrite having a pair of opposed main surfaces, multiple center electrodes, a pair of permanent magnets having main surfaces opposed to the main surfaces of the ferrite, a circuit board, and a yoke. The center electrodes are formed on the main surfaces of the permanent magnets using conductive films so that the center electrodes cross each other and are insulated from each other, and portions of each center electrode are electrically connected to each other through relay electrodes formed on end surfaces perpendicular to the main surfaces of the ferrite. The ferrite and the permanent magnets are disposed on the circuit board so that the respective main surfaces are substantially perpendicular to the surface of the circuit board. The yoke surrounds the ferrite and the permanent magnets, controlling the leakage of magnetic flux out of the nonreciprocal circuit device.

In the nonreciprocal circuit device described in Japanese Unexamined Patent Application Publication No. 2006-311455, the center electrodes are formed on the main surfaces of the permanent magnets using conductive films, and the main surfaces of the ferrite are interposed between the main surfaces of the permanent magnets. Thus, it is possible to obtain a nonreciprocal circuit device which is easy to manufacture compared to traditional devices formed by winding a metal line and which has good characteristics such as reduced size, increased positional accuracy, and fewer variations in electrical properties.

Meanwhile, nonreciprocal circuit devices including no yoke have been proposed in recent years. This configuration facilitates further downsizing of nonreciprocal circuit devices.

In a nonreciprocal circuit device including no yoke, however, as will be described below, the ferrite-magnet assembly composed of the ferrite and the permanent magnets may drop from the circuit board due to a shock caused by a drop or the like. More specifically, in the nonreciprocal circuit device described in Japanese Unexamined Patent Application Publication No. 2006-311455, the circuit board having the ferrite-magnet assembly mounted thereon is mounted on a mother circuit board and thus constitutes part of a circuit module. In the circuit module, the nonreciprocal circuit device is covered with a metal case disposed on the motherboard. When an electronic apparatus including a circuit module as described above receives a shock caused by a drop or the like, the metal case may become grossly deformed. At that time, the metal case may come into contact with the ferrite-magnet assembly of the nonreciprocal circuit device, which may in turn drop from the circuit board.

SUMMARY OF THE INVENTION

Accordingly, preferred embodiments of the present invention provide a circuit module that prevents a core isolator included in an isolator from dropping from a circuit board due to a shock.

A circuit module according to a preferred embodiment of the present invention includes a circuit board; an isolator including a core isolator mounted on the circuit board, the core isolator including a ferrite; a permanent magnet arranged to apply a direct-current magnetic field to the ferrite; a first center electrode disposed on the ferrite and having one end portion connected to an input port and the other end portion connected to an output port; and a second center electrode disposed on the ferrite so that the second center electrode crosses the first center electrode and is insulated from the first center electrode, the second center electrode having one end portion connected to the output port and the other end portion connected to a ground port; a plurality of electronic components mounted on the circuit board and arranged in a first straight line along with the core isolator; and a case disposed on the circuit board and covering the core isolator and the electronic components. The isolator includes no yoke for controlling the leakage of the direct-current magnetic field out of the isolator. The core isolator is interposed between the electronic components. The heights of the electronic components are greater than the height of the core isolator.

According to this preferred embodiment of the present invention, the core isolator included in the isolator can be prevented from dropping from the circuit board due to a shock.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Now, a circuit module according to preferred embodiments of the present invention will be described with reference to the attached drawings.

Figure 1:
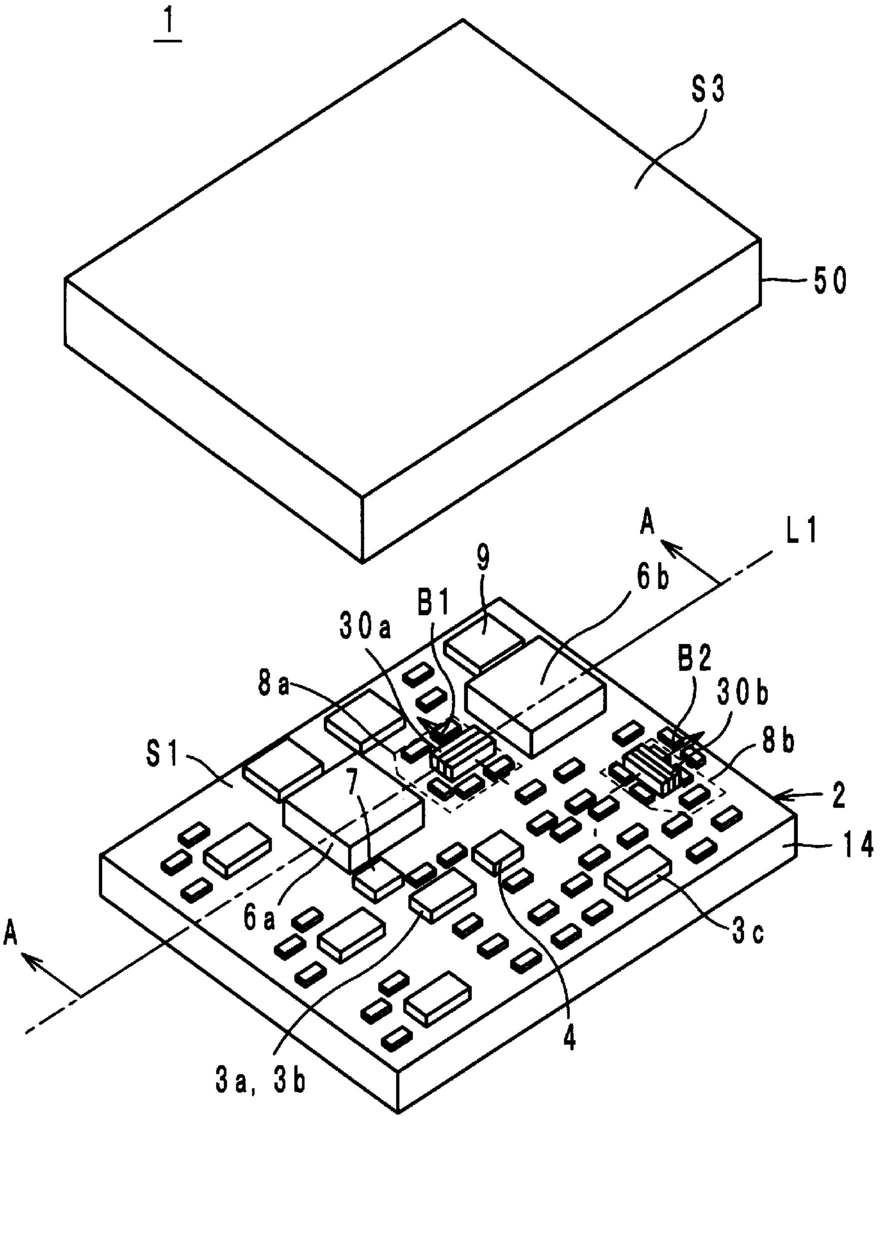
FIG. 1 is an exploded perspective view of a circuit module according to one preferred embodiment of the present invention.
Figure 2:
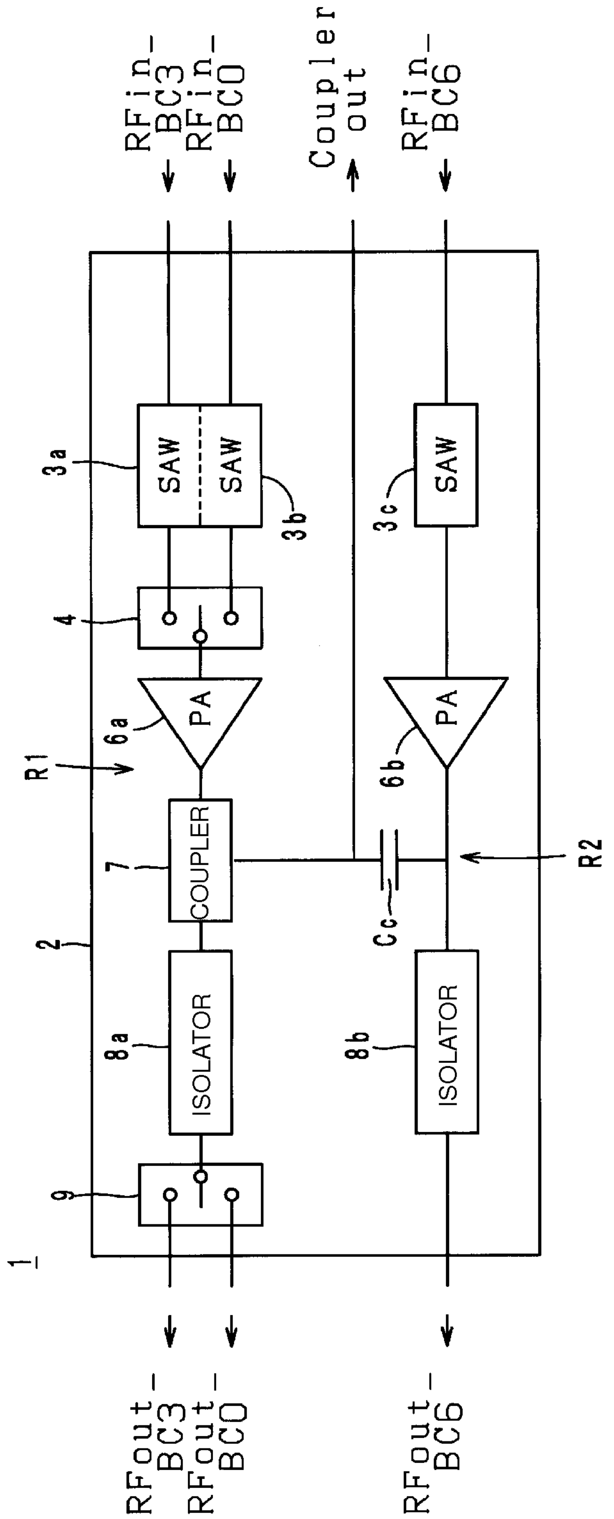
FIG. 2 is a block diagram of the circuit module of FIG. 1.
Figure 3:
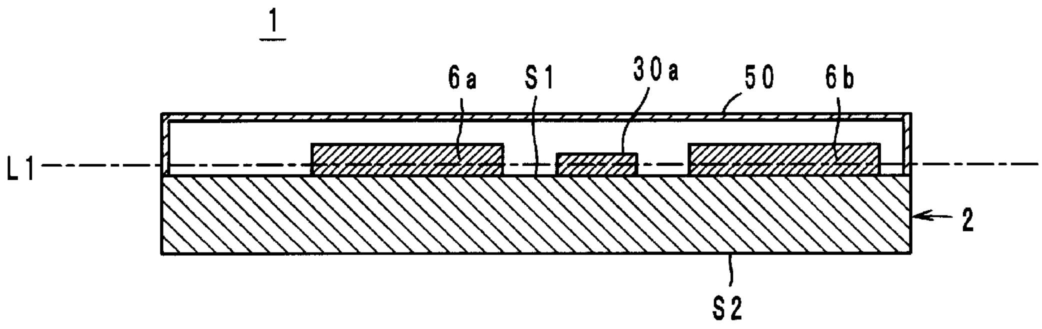
FIG. 3 is a sectional diagram taken along the line A-A of the circuit module of FIG. 1.

First, the configuration of the circuit module will be described with reference to the drawings. FIG. 1 is an exploded perspective view of a circuit module 1 according to one preferred embodiment of the present invention. FIG. 2 is a block diagram of the circuit module 1 of FIG. 1. FIG. 3 is a sectional diagram taken along the line A-A of the circuit module of FIG. 1. Note that FIG. 1 shows only major electronic components and omits minute electronic components such as a chip capacitor and a chip inductor.

The circuit module 1 preferably defines a portion of the transmission circuit of a wireless communication device such as a cellular phone, and amplifies and outputs multiple types of high-frequency signals. As shown in FIGS. 1 and 2, the circuit module 1 includes a circuit board 2, transmission paths R1 and R2 (not shown in FIG. 1), and a metal case 50.

As shown in FIGS. 1 and 3, the circuit board 2 preferably is a tabular multilayer printed board having electric circuits disposed thereon and therein. The circuit board 2 includes main surfaces S1 and S2.

As shown in FIG. 2, the transmission path R1 amplifies input signals RFin_BC0 (800-MHz band) and RFin_BC3 (900-MHz band) and outputs the amplified signals as output signals RFout_BC0 (800-MHz band) and RFout_BC3 (900-MHz band). As shown in FIG. 2, the transmission path R1 includes SAW filters (surface wave filters) 3*a* and 3*b*, a switch 4, a power amplifier 6*a*, a coupler 7, an isolator 8*a*, and a switch 9. As shown in FIG. 1, the SAW filters 3*a* and 3*b*, the switch 4, power amplifier 6*a*, the coupler 7, the isolator 8*a*, and the switch 9 are electronic components mounted on the main surface S1 of the circuit board 2.

The SAW filters 3*a* and 3*b* preferably include a single electronic component and are band-pass filters that allow only signals having a predetermined frequency to pass therethrough. As shown in FIG. 2, the SAW filters 3*a* and 3*b* are electrically connected to the input terminal (not shown) of the power amplifier 6*a* via the switch 4. The SAW filter 3*a* receives the input signal RFin_BC3, and the SAW filter 3*b* receives the input signal RFin_BC0.

The switch 4 is connected to the SAW filters 3*a* and 3*b* and the power amplifier 6*a* and outputs, to the power amplifier 6*a*, one of the input signal RFin_BC3 outputted by the SAW filter 3*a* and the input signal RFin_BC0 outputted by the SAW filter 3*b*.

The power amplifier 6*a* amplifies the input signal RFin_BC0 or input signal RFin_BC3 outputted by the switch 4. The power amplifier 6*a* is connected to the input terminal (not shown) of the coupler 7 disposed therebehind. The coupler 7 is connected to the input terminal (not shown) of the isolator 8*a*. It outputs a portion of the input signal RFin_BC0 or input signal RFin_BC3 amplified by the power amplifier 6*a* out of the circuit module 1 as an output signal Coupler out, as well as outputs the input signal RFin_BC0 or input signal RFin_BC3 to the isolator 8*a* disposed therebehind.

The isolator 8*a* is a nonreciprocal circuit device which outputs the input signal RFin_BC0 or input signal RFin_BC3 to the switch 9 disposed therebehind and which does not output a signal reflected from the switch 9 to the coupler 7. Details of the isolator 8*a* will be described later. The switch 9 outputs the input signal RFin_BC0 or input signal RFin_BC3 outputted by the isolator 8*a* out of the circuit module 1 as an output signal RFout_BC0 or output signal RFout_BC3.

The transmission path R2 amplifies an input signal RFin_BC6 (2-GHz band) and outputs the amplified signal as an output signal RFout_BC6 (2-GHz band). The transmission path R2 includes a SAW filter 3*c*, a power amplifier 6*b*, and an isolator 8*b*. As shown in FIG. 1, the SAW filter 3*c*, the power amplifier 6*b*, and the isolator 8*b* are electronic components mounted on the circuit substrate 2.

Further, as shown in FIG. 2, a capacitor Cc is disposed between the wiring line through from which the output signal Coupler out is outputted and the transmission path R2. More specifically, one end portion of the capacitor Cc is connected between the isolator 8*b* and the power amplifier 6*b*, and the other end portion thereof is connected to the wiring line through which the output signal Coupler out is outputted. The capacitor Cc outputs a portion of the input signal RFin_BC6 amplified by the power amplifier 6*b* out of the circuit module 1 as the output signal Coupler out.

The SAW filter 3*c* is a band-pass filter that allows only signals having a predetermined frequency to pass therethrough. The SAW filter 3*c* receives the input signal RFin_BC6.

The power amplifier 6*b* amplifies the input signal RFin_BC6 outputted by the SAW filter 3*c*. The isolator 8*a* is a nonreciprocal circuit device which outputs the input signal RFin_BC6 out of the circuit module 1 and which does not output an signal reflected from the outside of the circuit module 1 to the power amplifier 6*b*. Details of the isolator 8*b* will be described later.

The metal case 50 is mounted on the circuit board 2 and opposed to the main surface S1 of the circuit board 2. It has a substantially rectangular main surface S3, which covers the SAW filters 3*a* to 3*c*, the switch 4, the power amplifiers 6*a* and 6*b*, the coupler 7, the isolators 8*a* and 8*b*, and the switch 9. A ground potential is applied to the metal case 50 via an electrical circuit within the circuit board 2.

Figure 4:
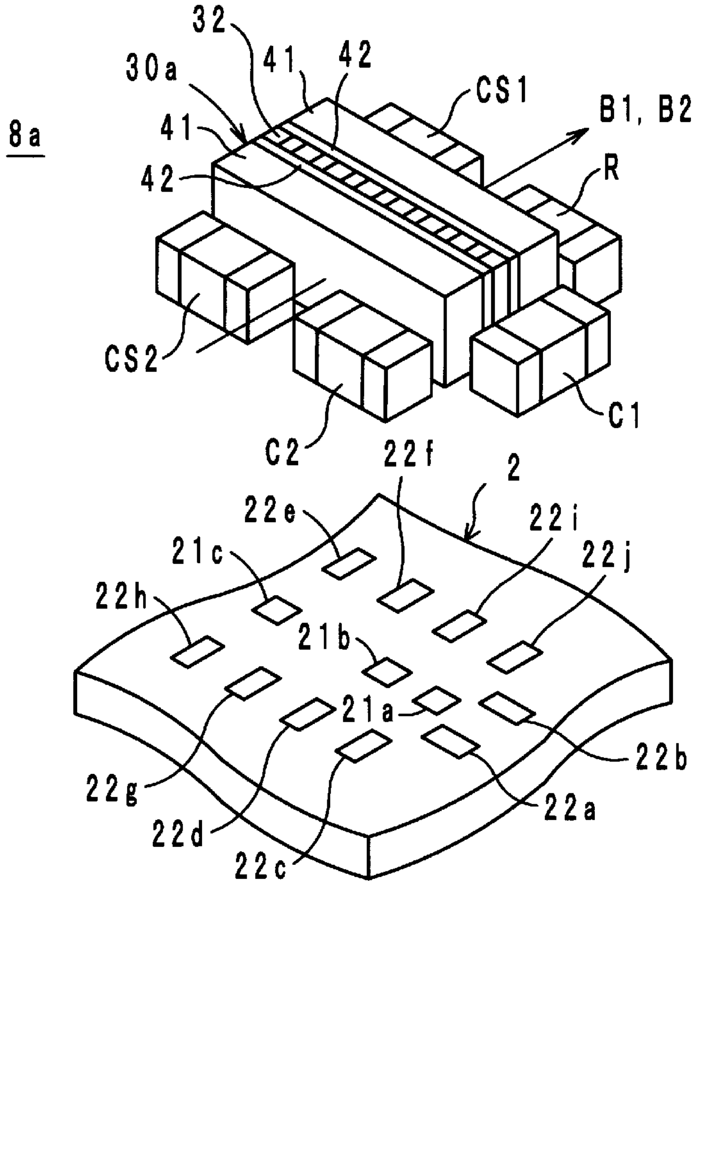
FIG. 4 is a perspective view of an isolator.
Figure 5:
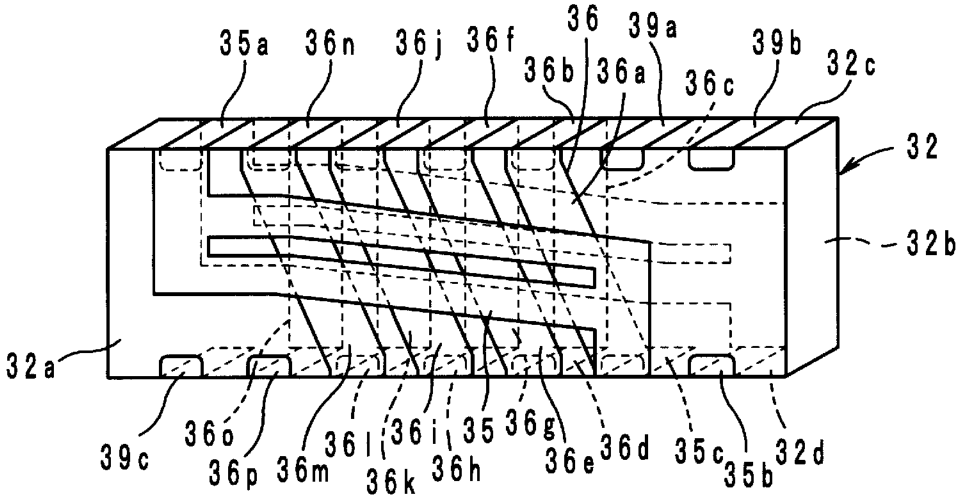
FIG. 5 is a perspective view of a ferrite on which center electrodes are disposed.
Figure 6:
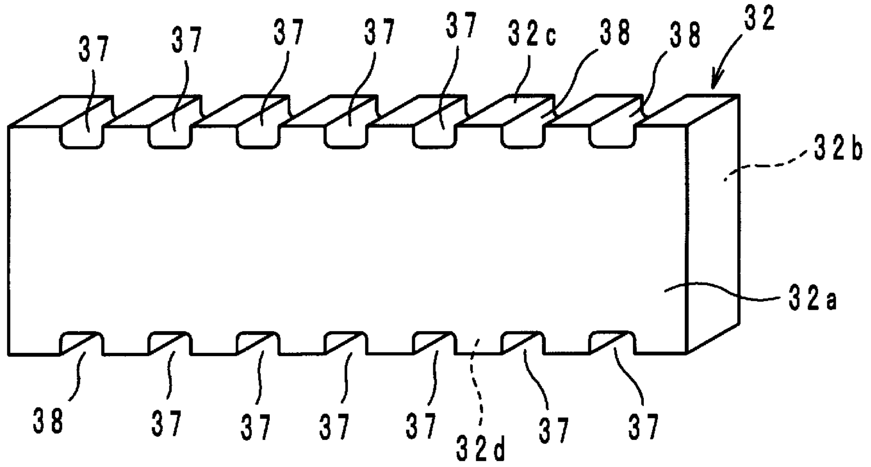
FIG. 6 is a perspective view of the ferrite.
Figure 7:
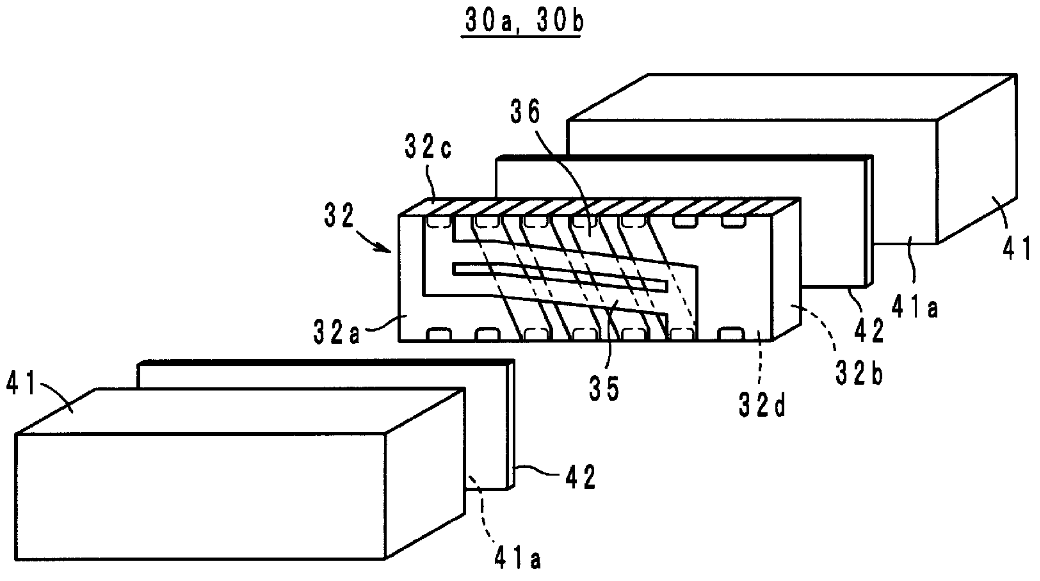
FIG. 7 is an exploded perspective view of a core isolator.

Hereafter, the isolators 8*a* and 8*b* will be described with reference to the drawings. FIG. 4 is a perspective view of the isolator 8*a*. FIG. 5 is a perspective view of a ferrite 32 on which center electrodes 35 and 36 are disposed. FIG. 6 is a perspective view of the ferrite 32. FIG. 7 is an exploded perspective view of core isolators 30*a* and 30*b*.

The isolator 8*a* is a lumped constant circuit and, as shown in FIG. 4, includes the circuit board 2, the core isolator 30*a*, capacitors C1, C2, CS1, and CS2, and a resistor R. As with the isolator 8*a*, the isolator 8*b* is a lumped constant circuit and includes the circuit board 2, the core isolator 30*b*, capacitors C1, C2, CS1, and CS2, and a resistor R. Note that the isolators 8*a* and 8*b* do not include a yoke for controlling the leakage of a direct-current magnetic field out of the isolators. Since the isolators 8*a* and 8*b* have the same configuration, the isolator 8*a* will be described below as an example.

As shown in FIG. 4, the core isolator 30*a* includes the ferrite 32 and a pair of permanent magnets 41. Note that the core isolator 30*a* according to this preferred embodiment preferably is a portion composed of only the ferrite 32 and the permanent magnets 41, for example. As shown in FIG. 5, the center electrodes 35 and 36, which are electrically insulated from each other, are disposed on a front main surface 32*a* and a back main surface 32*b* of the ferrite 32. The ferrite 32 is substantially rectangular parallelepiped-shaped and has the main surfaces 32*a* and 32*b* opposed and parallel or substantially parallel to each other.

The permanent magnets 41 are bonded to the main surfaces 32*a* and 32*b* of the ferrite 32 preferably using, for example, an epoxy adhesive 42 so that direct-current magnetic fields B1 and B2 are applied to the main surfaces 32*a* and 32*b* approximately perpendicularly (see FIG. 7). Main surfaces 41*a* of the permanent magnets 41 have the same sizes as those of the main surfaces 32*a* and 32*b* of the ferrite 32. The ferrite 32 and the permanent magnets 41 are opposed to each other so that the external shapes of the main surfaces 32*a* and 32*b* and those of the main surfaces 41*a* are matched.

The center electrode 35 is a conductive film. Specifically, as shown in FIG. 5, the center electrode 35 rises from the lower right to the upper left on the main surface 32*a* of the ferrite 32 as inclined at a relatively small angle with respect to a long side of the main surface 32*a* while branching into two portions in the middle. The center electrode 35 then extends to the main surface 32*b* via a relay electrode 35*a* on an upper surface 32*c*. The center electrode 35 then branches into two portions so that the two portions on the main surface 32*b* overlap the two portions on the main surface 32*a* in a perspective view. One end portion of the center electrode 35 is connected to a connection electrode 35*b* located on a lower surface 32*d*. The other end portion thereof is connected to a connection electrode 35*c* located on the lower surface 32*d*. As seen, the center electrode 35 is wound around the ferrite 32 by one turn. The center electrode 35 and the center electrode 36 to be discussed below cross each other and are insulated from each other owing to the disposition of an insulating film therebetween. The crossing angle of the center electrodes 35 and 36 is set as required so that input impedance or insertion loss is adjusted.

The center electrode 36 is a conductive film. The center electrode 36 is disposed on the main surface 32*a* as a 0.5th-turn 36*a* so that it extends from the lower right to the upper left as inclined toward the long side of the main surface 32*a* at a relatively large angle while crossing the center electrode 35; it extends to the main surface 32*b* through a relay electrode 36*b* on the upper surface 32*c*; and it is disposed on the main surface 32*b* as a first turn 36*c* so that it crosses the center electrode 35 approximately perpendicularly. The center electrode 36 then extends to the main surface 32*a* through a relay electrode 36*d* on the lower surface 32*d*; it is disposed on the main surface 32*a* as a 1.5th turn 36*e* so that it crosses the center electrode 35 in parallel with the 0.5th turn 36*a*; and it extends to the main surface 32*b* through a relay electrode 36*f* on the upper surface 32*c*. Similarly, the center electrode 36 is defined by a second turn 36*g*, a relay electrode 36*h*, a 2.5th turn 36*i*, a relay electrode 36*j*, a third turn 36*k*, a relay electrode 36*l*, a 3.5th turn 36*m*, a relay electrode 36*n*, and a fourth turn 36*o* on the surfaces of the ferrite 32. Both end portions of the center electrode 36 are connected to the connection electrodes 35*c* and 36*p* located on the lower surface 32*d* of the ferrite 32. Note that the connection electrode 35*c* is commonly used by the end portions of the center electrodes 35 and 36.

The connection electrodes 35*b*, 35*c*, and 36*p* and the relay electrodes 35*a*, 36*b*, 36*d*, 36*f*, 36*h*, 36*j*, 36*l*, and 36*n* are formed preferably by coating or filling recesses 37 (see FIG. 6) formed on the upper surface 32*c* and the lower surface 32*d* of the ferrite 32 with electrode conductors made of silver, a silver alloy, copper, a copper alloy, or the like, for example. Further, recesses 38 are disposed on the upper surface 32*c* and the lower surface 32*d* in parallel or substantially in parallel with the connection and relay electrodes, and dummy electrodes 39*a*, 39*b*, and 39*c* are disposed therein. The dummy electrodes are formed preferably by previously forming through holes on the mother ferrite board, filling the through holes with electrode conductors, and then cutting the electrode conductors at positions dividing the through holes. Alternatively, the connection, relay, and dummy electrodes may be formed in the recesses 37 and recesses 38 as conductive films.

YIG ferrite or the like is used as the ferrite 32. The center electrodes 35 and 36 and the other electrodes can preferably be formed as thick films or thin films formed of silver or a silver alloy by a construction method such as printing, transfer, or photolithograph, for example. Examples of the film for insulating the center electrodes 35 and 36 preferably include a thick dielectric film formed of glass, alumina, or the like and a resin film formed of polyimide. These films can also be formed by a method such as printing, transfer, or photolithograph, for example.

The ferrite 32 can be fired in combination with the insulating film and the various electrodes using a magnetic material. In this case, Pd, Ag, or Pd/Ag, which withstand high-temperature firing, is preferably used to form the various electrodes.

Typically, strontium-based, barium-based, or lanthanum-cobalt-based ferrite magnets are used as the permanent magnets 41. A single-component, thermosetting epoxy adhesive is most suitably used as the adhesive 42 for bonding the permanent magnets 41 and the ferrite 32 together, for example.

While the circuit board 2 is preferably formed of the same material as that of a general multilayer printed board, it may be a multilayer ceramic board obtained by layering multiple insulating ceramic layers. Terminal electrodes 21*a*, 21*b*, 21*c*, and 22*a* to 22*j* for mounting the core isolator 30*a*, the capacitors C1, C2, CS1, and CS2, and the resistor R, input/output electrodes, ground electrodes (not shown), and the like are disposed on the circuit board 2.

The core isolator 30*a* is mounted on the circuit board 2. Specifically, the connection electrode 35*b*, 35*c*, and 36*p* on the lower surface 32*d* of the ferrite 32 are reflow-soldered to the terminal electrodes 21*a*, 21*b*, and 21*c* on the circuit board 2 for integration. That is, the core isolator 30*a* is fixed to the circuit board 2 by the terminal electrodes (fixing members) 21*a*, 21*b*, and 21*c* arranged in line.

The capacitor C1, C2, CS1, and CS2 and the resistor R are reflow-soldered to the terminal electrodes 22*a* to 22*j* on the circuit board 2. The core isolator 30*a*, the capacitors C1, C2, CS1, and CS2, and the resistor R are connected to one another via wiring lines within the circuit board 2, forming the isolator 8*a*.

Figure 8:
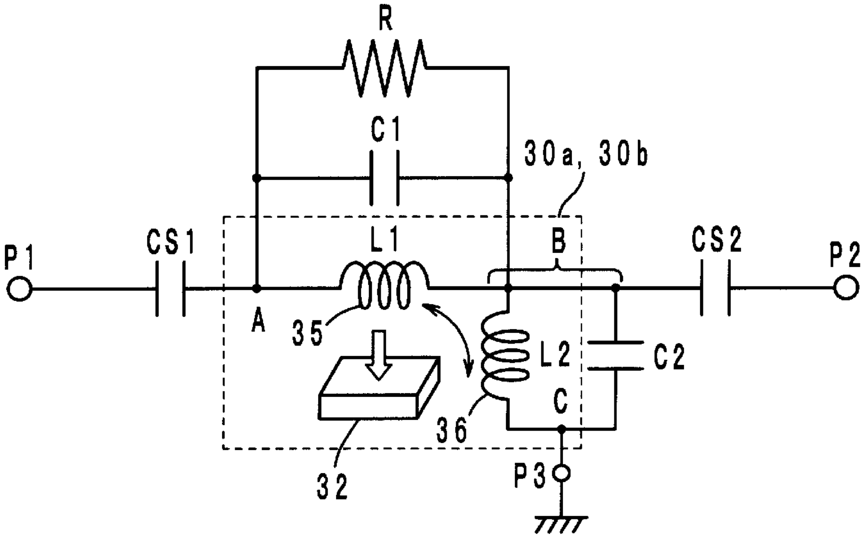
FIG. 8 is an equivalent circuit diagram of the isolator.

Next, the circuit configuration of the isolators 8*a* and 8*b* will be described with reference to the drawings. FIG. 8 is an equivalent circuit diagram of the isolators 8*a* and 8*b*.

An input port P1 is connected to the capacitor C1 and the resistor R via the capacitor CS1. The capacitor CS1 is connected to one end portion of the center electrode 35. The other end portion thereof and one end portion of the center electrode 36 are connected to the resistor R and the capacitors C1 and C2, as well as connected to an output port P2 via the capacitor CS2. The other end portion of the center electrode 36 and the capacitor C2 are connected to a ground port P3.

Since the isolators 8*a* and 8*b* preferably include of the above-mentioned equivalent circuit, these isolators can act as two-port, lumped-constant isolators having less insertion loss.

Meanwhile, the isolator 8*a* includes no yoke for controlling leakage of the direct-current magnetic field B1 out of the isolator 8*a*. For this reason, the isolator 8*a* preferably has a configuration that prevents the metal case 50 from coming into contact with the core isolator 30*a* due to a shock caused by a drop and thus prevents the core isolator 30*a* from dropping from the circuit board 2. Hereafter, this configuration will be described with reference to FIGS. 1 and 3.

As shown in FIGS. 1 and 3, the power amplifiers 6*a* and 6*b* are arranged in a straight line L1 along with the core isolator 30*a*, and the core isolator 30*a* are laterally interposed between the power amplifiers 6*a* and 6*b*. The heights of the power amplifiers 6*a* and 6*b* are greater than that of the core isolator 30*a*. The heights of the power amplifiers 6*a* and 6*b* and that of the core isolator 30*a* are equal or substantially equal to the distance from the main surface S1 of the circuit board 2 to the upper surfaces of the power amplifiers 6*a* and 6*b* and the distance from the main surface S1 to the upper surface of the core isolator 30*a*, respectively.

Owing to the above-mentioned disposition of the power amplifiers 6*a* and 6*b* and the core isolator 30*a*, the metal case comes into contact with the power amplifiers 6*a* and 6*b* earlier than with the core isolator 30*a* when deformed by a shock due to a drop. The contact with the power amplifiers 6*a* and 6*b* prevents further deformation of the metal case 50. That is, the metal case 50 is prevented from becoming grossly deformed to the extent that it comes into contact with the core isolator 30*a*. Thus, the core isolator 30*a* is prevented from dropping from the circuit board 2.

Further, the straight line L1 is approximately in parallel with the long sides of the main surface S3 of the metal case 50. Thus, the metal case 50 is more effectively prevented from coming into contact with the core isolator 30*a*. More specifically, the metal case 50 tends to be bent in its long-side direction rather than in its short side direction. For this reason, in the circuit module 1, the power amplifiers 6*a* and 6*b* and the core isolator 30*a* are arranged in the straight line L1 approximately in parallel with the long-side direction. Thus, even when the metal case 50 becomes deformed in the long-side direction, it is prevented from coming into contact with the core isolator 30*a* by the power amplifiers 6*a* and 6*b*. As a result, the core isolator 30*a* is prevented from dropping from the circuit board 2.

Further, the direction of the direct-current magnetic field B1 applied to the ferrite 32 of the core isolator 30*a* does not agree with the straight line L1. More specifically, the direction of the direct-current magnetic field B1 is substantially perpendicular to the straight line L1. This controls the passage of the direct-current magnetic field B1 through the power amplifiers 6*a* and 6*b*, controlling variations in the characteristics of the power amplifiers 6*a* and 6*b* due to the direct-current magnetic field B1.

The configuration of the circuit module 1 is not limited to that described in the preferred embodiment above and can be changed without departing from the spirit and scope of the present invention.

As shown in FIG. 1, the circuit module 1 preferably includes the core isolators 30*a* and 30*b*, and only the core isolator 30*a* is laterally interposed between the power amplifiers 6*a* and 6*b*. However, preferably, the core isolator 30*b* is also laterally interposed between tall electronic components like the power amplifiers 6*a* and 6*b*.

While the power amplifiers 6*a* and 6*b* are preferably used as the electronic components between which the core isolator 30*a* is interposed, other electronic components may be used. Examples of other electronic components include output switches and duplexers. Further, preferably, such electronic components are covered with a resin. Thus, the core isolator 30*a* as well as the electronic components can be protected from a shock.

Alternatively, the core isolators 30*a* and 30*b* and the power amplifiers 6*a* and 6*b* may be arranged in line, and either the power amplifier 6*a* or power amplifier 6*b* may be interposed between the core isolators 30*a* and 30*b*. Thus, the power amplifier 6*a* or power amplifier 6*b* disposed between the core isolators 30*a* and 30*b* prevents the metal case 50 from coming into contact with both the core isolators 30*a* and 30*b*.

Meanwhile, the core isolator 30*a* is fixed to the circuit board 2 by the terminal electrodes (fixing members) 21*a* to 21*c* arranged in the straight line. In FIG. 1, the straight line is in parallel with the straight line L1. Alternatively, the straight line may be, for example, approximately perpendicular to the straight line L1 rather than in parallel therewith. Since the core isolator 30*a* is fixed to the circuit board 2 by the terminal electrodes 21*a* to 21*c* arranged in the straight line, the core isolator 30*a* does not easily drop from the circuit board 2 when a force is applied to the core isolator 30*a* along the straight line in which the terminal electrodes 21*a* to 21*c* are arranged (that is, when a force is applied to the ferrite 32). However, when a force is applied in the direction perpendicular to the straight line in which the terminal electrodes 21*a* to 21*c* are arranged (for example, when a force is applied to the permanent magnets 41), the core isolator 30*a* may drop from the circuit board 2. For this reason, the straight line in which the terminal electrodes 21*a* to 21*c* are arranged and the straight line L1 are preferably arranged substantially perpendicular to each other. Thus, the power amplifiers 6*a* and 6*b* and the permanent magnets 41 come close to each other, allowing the power amplifiers 6*a* and 6*b* to prevent the metal case 50 from coming into contact with the permanent magnets 41.

Preferred embodiments of the present invention are useful in a circuit module and, in particular, excellent in that it can prevent the core isolator included in the isolator from dropping from the circuit board due to a shock.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A circuit module comprising:

a circuit board;

an isolator including a core isolator mounted on the circuit board, the core isolator including:

a ferrite;

a permanent magnet arranged to apply a direct-current magnetic field to the ferrite;

a first center electrode disposed on the ferrite and having one end portion connected to an input port and the other end portion connected to an output port; and a second center electrode disposed on the ferrite so that the second center electrode crosses the first center electrode and is insulated from the first center electrode, the second center electrode having one end portion connected to the output port and the other end portion connected to a ground port;

a plurality of electronic components mounted on the circuit board and arranged in a first straight line along with the core isolator; and a case disposed on the circuit board and covering the core isolator and the electronic components; wherein the isolator does not include a yoke for controlling the leakage of the direct-current magnetic field out of the isolator;

the core isolator is interposed between the electronic components; and heights of the electronic components are greater than a height of the core isolator.

2. The circuit module according to claim 1, wherein the case is opposed to the circuit board and includes a rectangular main surface, and the first straight line is approximately parallel with longer sides of the main surface.

3. The circuit module according to claim 1, wherein a direction of the direct-current magnetic field applied to the ferrite is different from a direction in which the first straight line extends.

4. The circuit module according to claim 1, wherein the electronic components are covered with a resin.

5. The circuit module according to claim 1, wherein the isolator includes a plurality of core isolators, and the electronic components are disposed between the plurality of core isolators.

6. The circuit module according to claim 1, wherein the core isolator is fixed to the circuit board by a plurality of fixing members arranged in a second straight line approximately perpendicular to the first straight line.

* * * * *